(12) United States Patent
Matsumori et al.

(10) Patent No.: US 10,542,648 B2
(45) Date of Patent: Jan. 21, 2020

(54) PART FEEDING DEVICE AND PART MOUNTING APPARATUS

(71) Applicant: PANASONIC INTELLECTUAL PROPERTY MANAGEMENT CO., LTD., Osaka (JP)

(72) Inventors: Masashi Matsumori, Osaka (JP); Takashi Nakamura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 550 days.

(21) Appl. No.: 15/292,831

(22) Filed: Oct. 13, 2016

(65) Prior Publication Data

US 2017/0112030 A1    Apr. 20, 2017

(30) Foreign Application Priority Data

Oct. 14, 2015    (JP) ................... 2015-202880

(51) Int. Cl.
*H05K 13/04*    (2006.01)
*H05K 13/08*    (2006.01)

(52) U.S. Cl.
CPC ..... *H05K 13/0417* (2013.01); *H05K 13/0419* (2018.08); *H05K 13/08* (2013.01); *Y10T 29/53174* (2015.01)

(58) Field of Classification Search
CPC ........ H05K 13/02; H05K 13/04; H05K 13/00; H05K 13/046; H05K 13/08; H05K 13/0419; H05K 13/0417; Y10T 29/5313; Y10T 29/53174

USPC .................... 29/729, 739, 740, 741
See application file for complete search history.

(56) References Cited

U.S. PATENT DOCUMENTS

| 7,866,518 | B2* | 1/2011 | Wada ................. | H05K 13/0417 |
| | | | | 226/128 |
| 8,353,424 | B2* | 1/2013 | Ikeda ................. | H05K 13/0419 |
| | | | | 221/25 |
| 9,414,536 | B2* | 8/2016 | Yamasaki ............. | H05K 13/02 |
| 9,578,793 | B2* | 2/2017 | Kitani ................. | H05K 13/02 |
| 9,743,569 | B2* | 8/2017 | Matsumori ........ | H05K 13/0417 |
| 9,802,399 | B2* | 10/2017 | Ohashi ................. | B32B 37/12 |
| 9,957,126 | B2* | 5/2018 | Ohashi .............. | H05K 13/0215 |

(Continued)

FOREIGN PATENT DOCUMENTS

| JP | 2005-539370 A | 12/2005 |
| JP | 2015-076447 A | 4/2015 |

*Primary Examiner* — Peter Dungba Vo
*Assistant Examiner* — Kaying Kue
(74) *Attorney, Agent, or Firm* — Pearne & Gordon LLP

(57) ABSTRACT

A tape feeder (part feeding device) includes a main body including a transporting passage for guiding a part feeding tape to a part removing position, a conveyor for positioning a storage of the part feeding tape which is inserted to the transporting passage to the part removing position, and a part detector for detecting the part stored in the storage in the transporting passage at the upstream side of the part removing position. The transporting passage includes a travelling surface for supporting the part feeding tape from underneath, a pair of side guides for guiding two side surfaces of the part feeding tape, and a squeezed portion in which a distance between the pair of side guides is gradually reduced from the upstream side of the part detector toward a part detecting position of the part detector.

8 Claims, 7 Drawing Sheets

(56) References Cited

U.S. PATENT DOCUMENTS

| | | | |
|---|---|---|---|
| 10,112,418 B2 * | 10/2018 | Matsumori | .......... B41J 13/0009 |
| 10,123,468 B2 * | 11/2018 | Matsumori | ........ H05K 13/0419 |
| 2003/0219330 A1 | 11/2003 | Lyndaker | |

* cited by examiner

PART FEEDING DEVICE AND PART MOUNTING APPARATUS

BACKGROUND

1. Technical Field

The present disclosure relates to a part feeding device for supplying a part to a storage by transporting a part feeding tape with the part held therein and a part mounting apparatus for mounting the fed part on a substrate.

2. Description of the Related Art

As a part feeding device in a part mounting apparatus for mounting a part on a substrate, a tape feeder for supplying the part has been widely used in the form of a part feeding tape with a part held in a pocket-type storage. As the tape feeder, a tape feeder having a part detecting sensor for detecting the presence or absence of the parts in the storage of the part feeding tape is conventionally known (for example, refer to PTL 1 and PTL 2). In the related art shown in these patent literature publications, the presence or absence of the part in the storage of the part feeding tape is determined by an optical sensor having a light receiver and a light emitter disposed on a transporting passage of the part feeding tape.

CITATION LIST

Patent Literature

PTL 1: PCT Japanese Translation Patent Publication No. 2005-539370

PTL 2: Japanese Patent Unexamined Publication No. 2015-76447

SUMMARY

According to an aspect of the present disclosure, there is provided a part feeding device which transports a part feeding tape which stores a part in a storage to a part removing position to feed the part stored in the storage to a part mounting apparatus, the part feeding device including: a main body including a transporting passage for guiding the part feeding tape from an inserting port for inserting the part feeding tape to the part removing position; a conveyor for positioning the storage of the part feeding tape which is inserted from the inserting port to the transporting passage to the part removing position; and a part detector for detecting the part stored in the storage in the transporting passage located at a downstream side of the inserting port and at an upstream side of the part removing position. The transporting passage includes a travelling surface for supporting the part feeding tape from underneath, a pair of side guides for guiding side surfaces of the part feeding tape, and a squeezed portion in which a distance between the pair of side guides is gradually reduced from an upstream side of the part detector toward a part detecting position of the part detector.

In addition, according to another aspect of the present disclosure, there is provided a part mounting apparatus which transports a part feeding tape which stores a part in a storage to a part removing position and removes the part from the storage in the part removing position to mount the part on a substrate, the part mounting apparatus including: a main body including a transporting passage for guiding the part feeding tape from an inserting port for inserting the part feeding tape to the part removing position; a conveyor for positioning the storage of the part feeding tape which is inserted from the inserting port to the transporting passage to the part removing position; a part detector for detecting the part stored in the storage in the transporting passage located at a downstream side of the inserting port and at an upstream side of the part removing position; and a mounting head which removes the part from the storage which is positioned in the part removing position to mount the removed part on the substrate. The transporting passage includes a travelling surface for supporting the part feeding tape from underneath, a pair of side guides for guiding side surfaces of the part feeding tape, and a squeezed portion in which a distance between the pair of side guides is gradually reduced from an upstream side of the part detector toward a part detecting position of the part detector.

DETAILED DESCRIPTION

Prior to descriptions of an exemplary embodiment of the present disclosure, problems in a related art apparatus will be briefly explained.

In the related art including above described PTL 1 and PTL 2, since a position or a posture of a part feeding tape which moves along a transporting passage is not always stable, a positional relationship between a storage in which parts are stored and a part detecting sensor cannot satisfy an aspect suitable for part detecting. Accordingly, there is a problem in that fine parts cannot be stably detected.

EXEMPLARY EMBODIMENT

Figure 1:
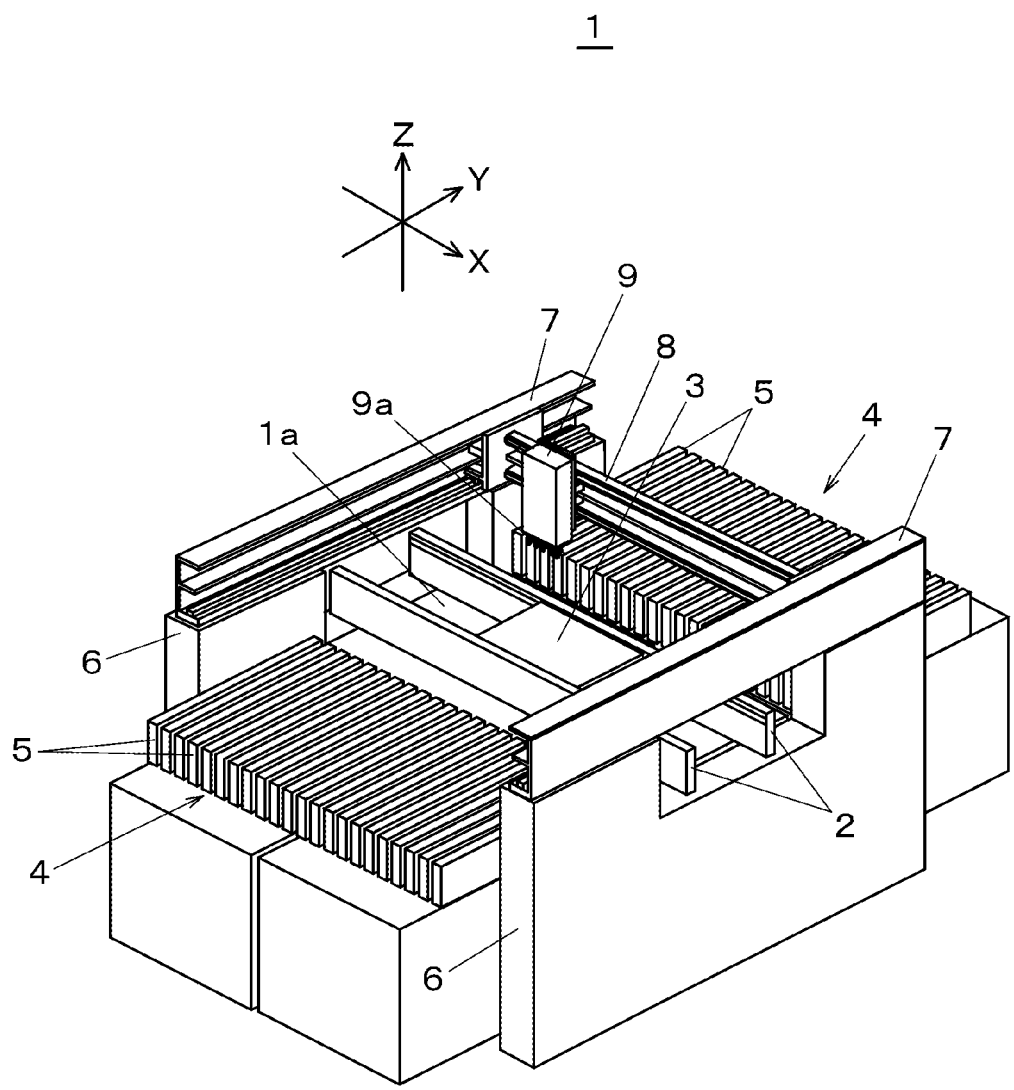
FIG. 1 is a perspective view of a part mounting apparatus using a part feeding device according to an exemplary embodiment of the present disclosure.

Next, an exemplary embodiment of the present disclosure will be described with reference to the drawings. First, a configuration and a function of part mounting apparatus 1 will be described with reference to FIG. 1. Part mounting apparatus 1 has a function of mounting parts to a substrate. Hereinafter, a transporting direction of the substrate is defined as an X-direction, a direction perpendicular to the X-direction in a horizontal plane is defined as a Y-direction, and a direction perpendicular to a XY plane is defined as a Z-direction. In FIG. 1, substrate transporting mechanism 2 including a pair of transporting conveyer is disposed on the center portion of base mounting portion 1a in the X-direction. Substrate transporting mechanism 2 receives substrate 3 to be subjected to a part mounting work from an upstream-side apparatus (not shown), transports the substrate to a mounting work position in part mounting apparatus 1 and positions and holds the substrate.

Component feeders 4 are disposed on the both sides of substrate transporting mechanisms 2, and in component feeders 4, a plurality of tape feeders 5 are provided respectively. Tape feeder 5 is a part feeding device for feeding a part to be mounted on part mounting apparatus 1 and has a function of transporting part feeding tape T storing parts P in storages 20a shown in FIGS. 6A and 6B to a part removing position (refer to part removing position 12 shown in FIG. 2) by mounting head 9 to be described below.

Y-axis beams 7 including a linear driving mechanism are disposed in the Y-direction, respectively on the upper surface of a pair of frame members 6 disposed in the both end portions of part mounting apparatus 1 in the X-direction. X-axis beams 8 having the linear driving mechanism are provided between Y-axis beams 7 and are moveable in the Y-direction, and mounting head 9 is mounted on X-axis beam 8 such that mounting head 9 is moveable in the X-direction. Mounting head 9 has a plurality of adsorption nozzles 9a on the lower surface. Mounting head 9 is moved in XY-directions by driving Y-axis beam 7 and X-axis beam 8. Therefore, mounting head 9 removes part P from storage 20a positioned on part removing position 12 of tape feeder 5 to mount part P on substrate 3.

Figure 6A:
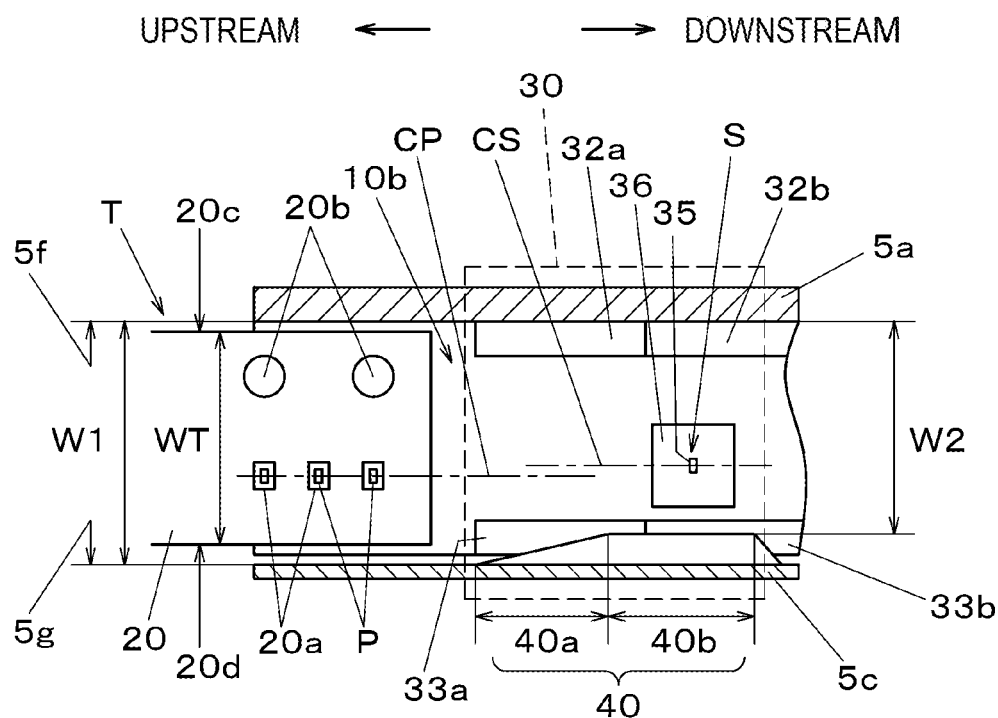
FIG. 6A is an explanatory view of a detection of parts by the part detector of the part feeding device according to the exemplary embodiment of the present disclosure.
Figure 6B:
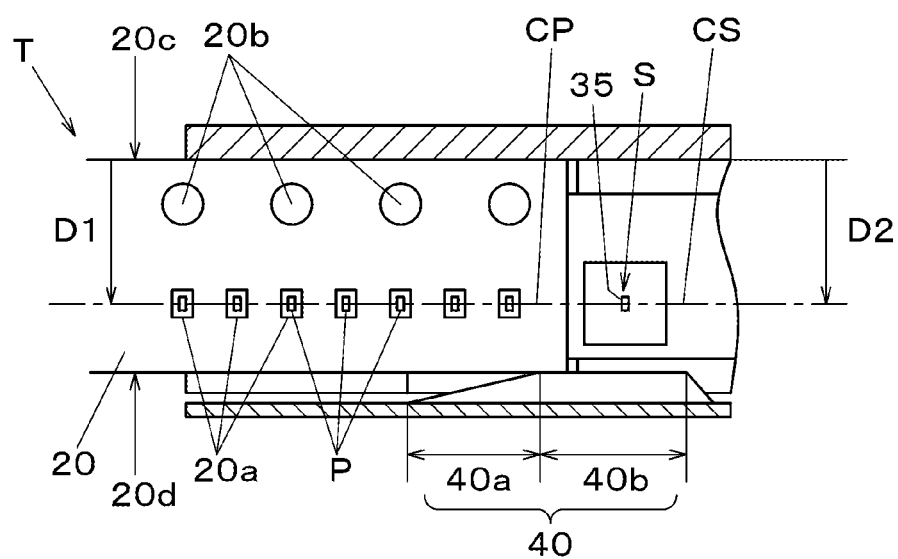
FIG. 6B is an explanatory view of the detection of the parts by the part detector of the part feeding device according to the exemplary embodiment of the present disclosure.

That is, part mounting apparatus 1 transports part feeding tape T which stores part P in storage 20a to part removing position 12 and removes part P from storage 20a of part removing position 12 to mount the removed part to substrate 3 positioned on a mounting work position by substrate transporting mechanism 2. In FIGS. 6A and 6B, part feeding tape T mainly includes base tape 20 in which storage 20a for storing part P and feed hole 20b for feeding part feeding tape T are formed. Since storage 20a is formed by a material capable of transmitting light, storage 20a has a structure capable of transmitting light radiated from the lower side of storage 20a.

Figure 2:
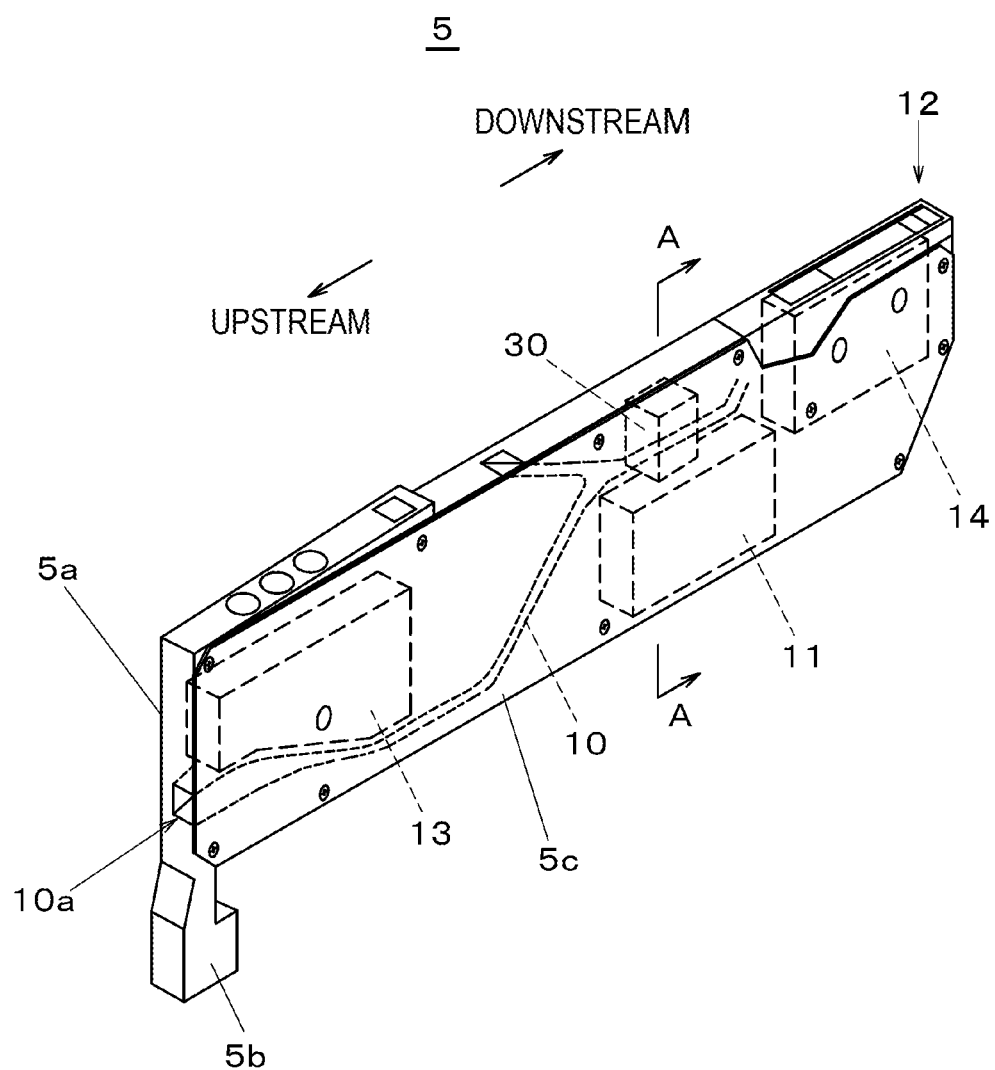
FIG. 2 is an explanatory view of the part feeding device according to the exemplary embodiment of the present disclosure.

Next, the configuration and the function of tape feeder 5 will be described with reference to FIG. 2. In FIG. 2, tape feeder 5 includes main body 5a, mounting portion 5b provided on and projected downward from the lower surface of main body 5a, and cover plate 5c for covering the side surface of main body 5a. In a state where tape feeder 5 is mounted with the lower surface of main body 5a applied along a feeder base (not shown in the figure) of part mounting apparatus 1, tape feeder 5 is fixed and mounted to the feeder base by mounting portion 5b. In this state, feeder controller 11 housed in tape feeder 5 to control tape feeding is connected to a device controller (not shown in the figure) included in part mounting apparatus 1.

Transporting passage 10 which is used to guide part feeding tape T taken into tape feeder 5 is provided in main body 5a. Transporting passage 10 is provided extending from insertion port 10a, which opens at the end of the upstream side of tape feeder 5 in a tape feeding direction and inserts part feeding tape T, to the position including part removing position 12 by mounting head 9. Transporting passage 10 is a long tunnel-like space formed by a groove formed in main body 5a and cover plate 5c for covering the side surface of main body 5a. In this manner, main body 5a has transporting passage 10 for guiding part feeding tape T from insertion port 10a for inserting part feeding tape T to part removing position 12.

At the upstream side which is close to insertion port 10a in transporting passage 10, feeder 13 having a sprocket (not shown) to be rotationally driven by a motor (not shown) is disposed. Feeder 13 has a function of transporting part feeding tape T inserted from insertion port 10a to transporting passage 10 toward part removing position 12. When inserting part feeding tape T from insertion port 10a to transporting passage 10, feed hole 20b of part feeding tape T (refer to FIGS. 6A and 6B) is engaged with a sprocket included in feeder 13. When detecting the engagement, feeder controller 11 feeds part feeding tape T to the downstream side by driving a motor included in feeder 13.

At the upstream side immediately under part removing position 12 in transporting passage 10, conveyor 14 having a sprocket (not shown) to be rotationally driven by a motor (not shown) is disposed. Conveyor 14 has a function for positioning storage 20a of part feeding tape T to part removing position 12 by receiving part feeding tape T to be fed by feeder 13. When part feeding tape T transported from the upstream side is reached to conveyor 14, feed hole 20b of part feeding tape T is engaged with the sprocket included in conveyor 14. Feeder controller 11 sequentially positions storages 20a of part feeding tape T, in part removing position 12 by pitch feeding part feeding tape T to the downstream side by driving the motor included in conveyor 14.

In this manner, conveyor 14 positions storage 20a of part feeding tape T which is inserted from insertion port 10a to transporting passage 10 to part removing position 12. Tape feeder 5 serves as a part feeding device for transporting part feeding tape T, which stores part P in storage 20a, to part removing position 12, and feeding part P stored in storage 20a to part mounting apparatus 1.

In FIG. 2, part detector 30 including part detecting sensor 31 (refer to FIG. 3) for detection part P stored in storage 20a is disposed in transporting passage 10 between part removing position 12 and feeder 13 at the downstream side of insertion port 10a. That is, tape feeder 5 includes part detector 30 for detecting part P stored in storage 20a in transporting passage 10 at the downstream side of insertion port 10a and at the upstream side of part removing position 12. Part detecting sensor 31 is a light transmissive type sensor including light emitter 31a and light receiver 31b (refer to FIG. 3). Light emitter 31a and light receiver 31b are electrically connected to feeder controller 11. Feeder controller 11 is configured to control radiating of light by light emitter 31a and read a part detecting signal from light receiver 31b to determine the presence or absence of part P through processing the read part detecting signal.

Figure 3:
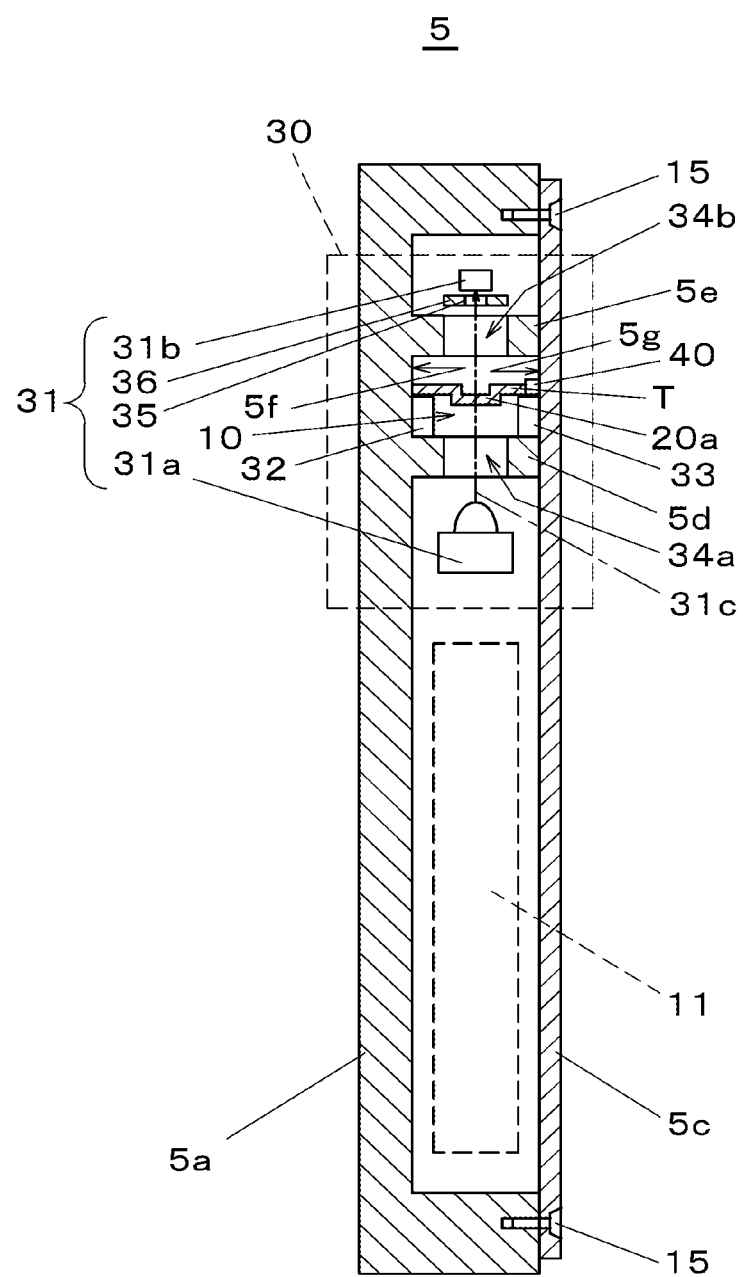
FIG. 3 is a cross-section view of a part detector of the part feeding device according to the exemplary embodiment of the present disclosure.
Figure 4:
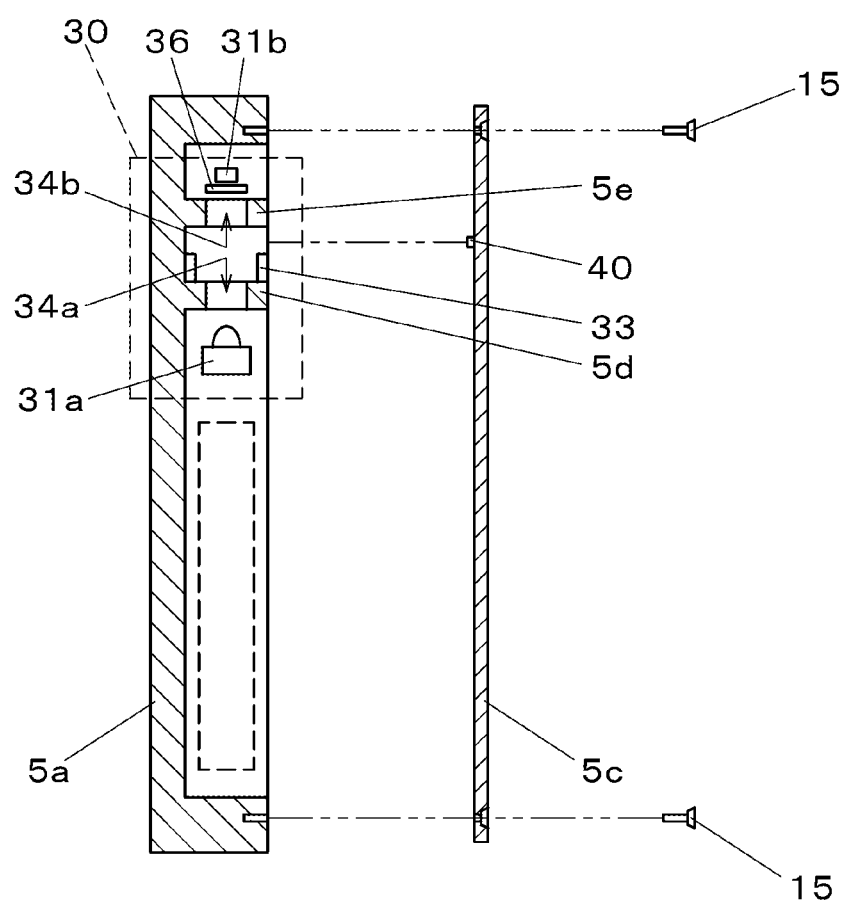
FIG. 4 is an exploded cross-sectional explanatory view of the part detector of the part feeding device according to the exemplary embodiment of the present disclosure.
Figure 5:
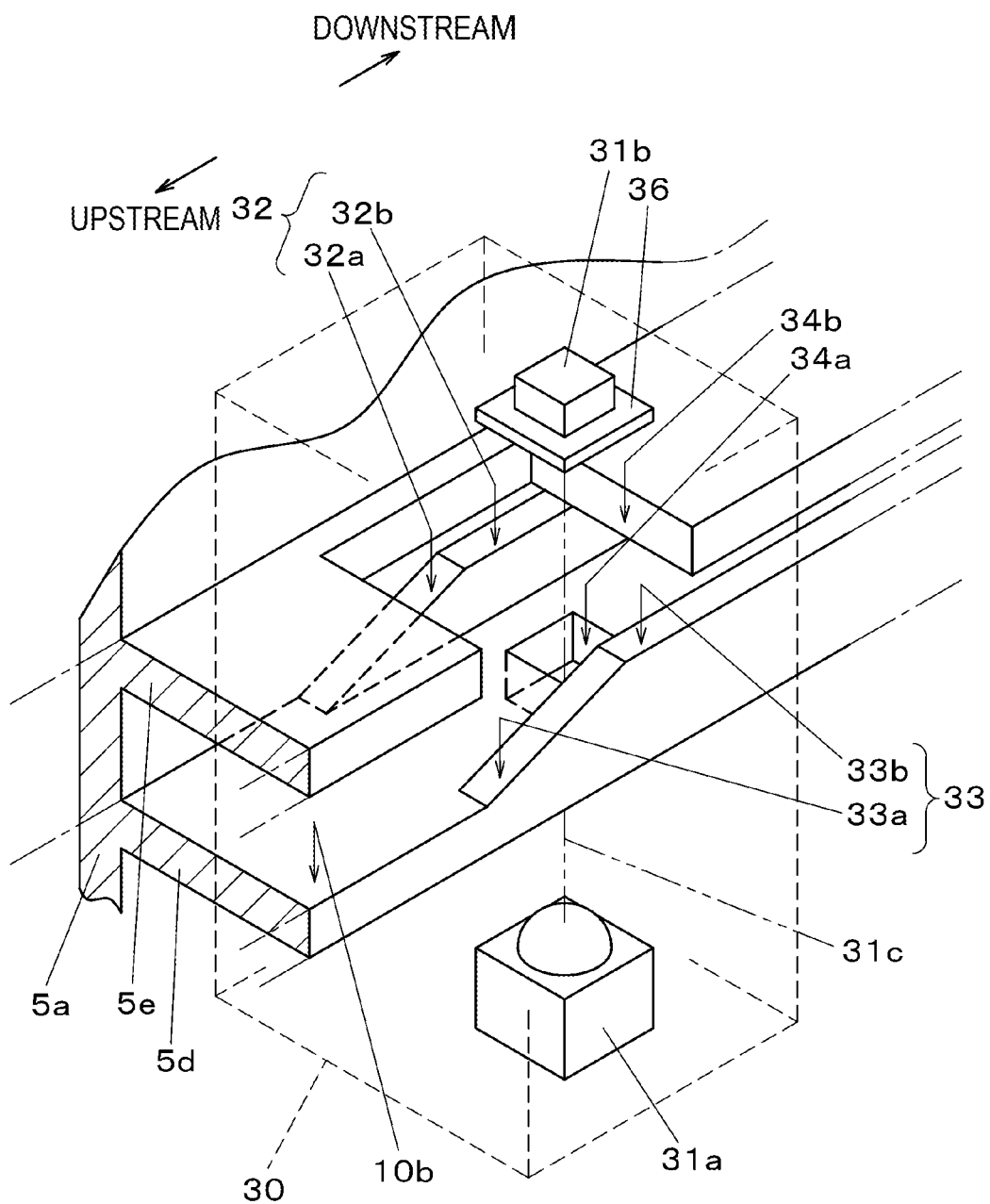
FIG. 5 is a structure explanatory view of the part detector of the part feeding device according to the exemplary embodiment of the present disclosure.

Next, a detailed configuration of tape feeder 5 will be described by focusing on part detector 30 with reference with FIGS. 3 to 5. FIGS. 3 and 4 illustrate an A-A cross-section in FIG. 2 and FIG. 4 illustrates a state where cover plate 5c is removed from main body 5a of tape feeder 5. FIG. 5 is an enlarged perspective view in the vicinity of part detector 30 in a state of removing cover plate 5c. In FIG. 3, lower portion 5d and upper portion 5e, which projects in a horizontal direction and which are disposed up and down so as to face each other, are provided in main body 5a configuring a frame of tape feeder 5. Cover plate 5c is screwed using screw 15 to the side surface of main body 5a. Tape feeder 5 is mounted on part mounting apparatus 1 in this state.

First, a configuration of transporting passage 10 to which part feeding tape T is transported will be described. In FIG. 3, a space which is surrounded by a side surface of main body 5a between lower portion 5d, upper portion 5e, lower portion 5d, and upper portion 5e (hereinafter, referred to as "first side surface 5f"), and a side surface of cover plate 5c between lower portion 5d and upper portion 5e (hereinafter, referred to as "second side surface 5g") configures a part of transporting passage 10 to which part feeding tape T is transported. First side surface 5f is a first side guide for guiding one side surface of part feeding tape T to be transported to transporting passage 10 and second side surface 5g is a second side guide for guiding the other side surface of part feeding tape T (refer to FIGS. 6A and 6B).

In FIG. 5, the upper surface of lower portion 5d of main body 5a is travelling surface 10b and guides the lower surface of part feeding tape T when transporting part feeding tape T. Main body side guide surface 32 and cover side guide surface 33 are provided in travelling surface 10b in part detector 30. Main body side guide surface 32 is configured to include first slope guide surface 32a along first side surface 5f and first horizontal guide surface 32b. Cover side guide surface 33 is configured to include second slope guide surface 33a along second side surface 5g and second horizontal guide surface 33b.

Heights of first slope guide surface 32a and second slope guide surface 33a are increased from the upstream side of transporting passage 10 toward the downstream side. First horizontal guide surface 32b and second horizontal guide surface 33b are extended from the terminals of first slope guide surface 32a and second slope guide surface 33a. Part feeding tape T of which the lower surface is guided to travelling surface 10b (upper surface of lower portion 5d) and transported is gradually adjacent to the lower surface (ceiling surface of transporting passage 10) of upper portion 5e by guiding the both end portion of the lower surface in part detector 30 to first slope guide surface 32a and second slope guide surface 33a. Part feeding tape T which is reached to first horizontal guide surface 32b and second horizontal guide surface 33b is guided to first horizontal guide surface 32b and second horizontal guide surface 33b and transported in a horizontal direction.

In FIG. 3, guide member 40 is disposed in the side surface of cover plate 5c (also, refer to FIG. 4). Guide member 40 is disposed so as to project to first side surface 5f side between cover side guide surface 33 and lower surface of upper portion 5e of main body 5a in a state where cover plate 5c is attached to main body 5a. Part feeding tape T which is transported through transporting passage 10 from the upper stream side guides the other side surface of part feeding tape T by guide member 40. That is, the second side guide for guiding the other side surface of part feeding tape T is configured to include cover plate 5c for covering main body 5a of tape feeder 5 (part feeding device) and guide member 40 which is disposed in a position facing transporting passage 10 of cover plate 5c so as to project to transporting passage 10 side.

Next, a configuration of part detecting sensor 31 for detecting the presence or absence of part P will be described. In FIG. 3, first opening 34a and second opening 34b are provided in lower portion 5d and upper portion 5e between light emitter 31a and light receiver 31b, respectively. Light emitter 31a is disposed in the lower side of first opening 34a which is provided at lower portion 5d. Light receiver 31b is disposed in the upper side of second opening 34b which is provided at upper portion 5e.

Light emitter 31a radiates light 31c toward light receiver 31b which is disposed at the upper side. Shielding member 36 for limiting light 31c from light emitter 31a to be incident to light receiver 31b is disposed between second opening 34b and light receiver 31b. Slit 35 that has passed through light 31c is provided in shielding member 36 (also, refer to FIGS. 6A and 6B). Slit 35 is disposed so as to overlap with a position that has passed through storage 20a of part feeding tape T. Therefore, when part feeding tape T to be transported is passed through the lower side of slit 35, a level of light 31c which is detected by light receiver 31b is changed depending on the presence or absence of part P in storage 20a.

That is, in a case where part P is present in storage 20a, light 31c which is detected by light receiver 31b is weakened and in a case where part P is not present in storage 20a, light 31c becomes stronger. Feeder controller 11 determines the presence or absence of part P based on the level of light 31c which is detected by light receiver 31b. In the present exemplary embodiment, a position of slit 35 that has passed light 31c becomes part detecting position S for detecting the presence or absence of part P (refer to FIGS. 6A and 6B). In the present exemplary embodiment, shielding member 36 including light emitter 31a, light receiver 31b, and slit 35 configures part detecting sensor 31 for detecting the presence or absence of part P which is stored in storage 20a which is positioned in part detecting position S.

Next, a detection of part P in part detector 30 will be described with reference FIGS. 6A and 6B. FIGS. 6A and 6B are schematic views of the vicinity of part detector 30 including transporting passage 10 of a part of upper stream side of part detector 30 when viewed from the upper side, and for the sake of simplicity, upper portion 5e of light receiver 31b and main body 5a and opening 34a of lower portion 5d of main body 5a are not illustrated.

In FIG. 6A, part feeding tape T which is inserted from insertion port 10a of tape feeder 5 transports a side surface having a plurality of feed holes 20b for transporting (hereinafter, referred to as "one tape side surface 20c") to first side surface 5f and transports a side surface without feed hole 20b (hereinafter, referred to as "other tape side surface 20d") to second side surface 5g, respectively from the upstream side toward the downstream side while guiding the side surfaces in a manner that the lower surface is set as travelling surface 10b of transporting passage 10. That is, first side surface 5f and second side surface 5g configure a first side guide for guiding one tape side surface 20c (a side having a plurality of feed holes 20b for transporting which is formed in part feeding tape T) and a pair of side guides which is formed of a second side guide for guiding other tape side surface 20d (side surface without feed holes 20b).

In FIG. 6A, guide member 40 disposed in second side surface 5g is configured to include squeezed portion 40a at the upstream side and stabilizer 40b at the downstream side. The side surface of squeezed portion 40a is gradually closer to facing first side surface 5f from the upstream side of part detector 30 toward part detecting position S. Squeezed portion 40a has a shape in which a width of transporting passage 10 is reduced (squeezed). Stabilizer 40b is substantially parallel to first side surface 5f facing the side surface thereof from the terminal end at the downstream side of squeezed portion 40a. Part detecting position S is positioned within a range of stabilizer 40b in the transporting direction of part feeding tape T.

In this manner, in guide member 40, the side surface of a part of guide member 40 becomes squeezed portion 40a which is gradually closer to first side surface 5f (first side guide) side from the upstream side of part detector 30 toward part detecting position S of part detector 30. The side surface of a part of the second side guide which is configured by including cover plate 5c and guide member 40 becomes squeezed portion 40a which is gradually closer to first side surface 5f (first side guide) side from the upstream side of part detector 30 toward part detecting position S of part detector 30.

In FIG. 6B, in part feeding tape T which is transported through transporting passage 10 from the upstream side, the both end portion of the lower surface is guided by first slope guide surface 32a and second slope guide surface 33a, in part detector 30. In this time, other tape side surface 20d is guided by the side surface of squeezed portion 40a and part feeding tape T is gradually pressed in first side surface 5f side. In the range of upstream side stabilizer 40b including part detecting position S, one tape side surface 20c and other tape side surface 20d of part feeding tape T are guided by each of side surfaces of first side surface 5f and upstream side stabilizer 40b.

In this manner, transporting passage 10 includes travelling surface 10b for supporting part feeding tape T from underneath, a pair of side guides for guiding one tape side surface 20c and other tape side surface 20d of part feeding tape T, and squeezed portion 40a in which a distance between the pair of side guides is gradually reduced from the upstream side of part detector 30 toward part detecting position S of part detector 30.

In FIG. 6A, width W1 (distance between first side surface 5f and second side surface 5g) of transporting passage 10 at the upstream side of part detector 30 is set so as to be greater than a maximum value of width WT of part feeding tape T. Therefore, part feeding tape T to be transported while shaking transporting passage 10 which is pushed out by feeder 13, vertically and horizontally is smoothly transported without stopping on the way of transporting passage 10. In addition, width W2 (distance between first side surface 5f and upstream side stabilizer 40b of guide member 40) of transporting passage 10 in part detecting position S is set to about the maximum value of width WT of part feeding tape T.

Specifically, in tape feeder 5 for transporting part feeding tape T having 8 mm of width, for example, width WT of part feeding tape T has a variation of about 7.8 mm to 8.2 mm. Width W1 of transporting passage 10 at the upstream side of part detector 30 suppresses a traveling resistance of part feeding tape T and is set to about 8.5 mm for obtaining the effect suppressing a generation of jamming. In addition, width W2 of transporting passage 10 in part detecting position S is set to about 8.3 mm. That is, width W2 of transporting passage 10 in part detecting position S is smaller than width W1 of transporting passage 10 at the upstream side of part detector 30 (W2<W1).

In FIG. 6B, center position CP of storage 20a of part feeding tape T in a width direction is defined based on one tape side surface 20c of part feeding tape T. Therefore, and in here, the distance is defined as distance D1. In addition, center position CS of slit 35 of shielding member 36 is set so as to overlap with storage 20a. That is, when the distance to center position CS of slit 35 which uses first side surface 5f as a base point is set as distance D2, distance D2 is set so as to be identical to distance D1 (D2=D1).

Next, an effect of guide member 40 in the detection of the presence or absence of part P by part detector 30 will be described. In transporting passage 10 at the upstream side of part detector 30, the position of part feeding tape T to be transported while shaking vertically and horizontally in the width direction is moved in width W1 of transporting passage 10 and in accordance with this, center position CP of storage 20a of part feeding tape T in the width direction is also moved. Therefore, as illustrated in FIG. 6A, before a tip end portion (end at the downstream side) of part feeding tape T is reached to upstream side stabilizer 40b of part detector 30, there is a case where center position CP of storage 20a of part feeding tape T is displaced without identical to center position CS of slit 35.

In particular, part feeding tape T before part feeding tape T is reached to conveyor 14 and feed hole 20b is engaged to the sprocket of conveyor 14 is greatly swung at transporting passage 10. Therefore, a positional deviation of center position CP of storage 20a and center position CS of slit 35 tends to be large.

In addition, in a case where part P which is stored in part feeding tape T is fine part P such as 0402 size (0.4 mm×0.2 mm), deviation amounts of center position CP of storage 20a and center position CS of slit 35 are the same as the size of storage 20a, in some cases. In a case where the deviation amount is greater than the size of storage 20a, since the light passed through storage 20a is shielded by slit 35, light 31c to be incident to light receiver 31b is reduced regardless of absence of part P in storage 20a. Accordingly, there is a case of an error determination that part P is present.

On the other hand, as illustrated in FIG. 6B, when part feeding tape T is reached to upstream side stabilizer 40b of guide member 40, since width W2 of transporting passage 10 is reduced to about the maximum value of width WT of part feeding tape T, the deviation amounts of center position CP of storage 20a of part feeding tape T and center position CS of slit 35 become smaller. Accordingly, even when part P is fine part P and the size of storage 20a is small, since storage 20a can be passed immediately below slit 35, that is, through part detecting position S, the presence or absence of part P of storage 20a can be reliably detected. In addition, since the width of transporting passage 10 is gradually reduced by squeezed portion 40a, the transporting of part feeding tape T is not being hindered.

As described above, tape feeder 5 (part feeding device) and part mounting apparatus 1 of the present exemplary embodiment include main body 5a including transporting passage 10 for guiding part feeding tape T from insertion port 10a for inserting part feeding tape T to part removing position 12, conveyor 14 for positioning storage 20a of part feeding tape T which is inserted from insertion port 10a to transporting passage 10 to part removing position 12, and part detector 30 for detecting part P stored in storage 20a in transporting passage 10 at the downstream side of insertion port 10a and at the upstream side of part removing position 12.

Transporting passage 10 includes travelling surface 10b for supporting part feeding tape T from underneath, a pair of side guides (first side surface 5f and second side surface 5g) for guiding one tape side surface 20c and other tape side surface 20d of part feeding tape T, and squeezed portion 40a in which distances (widths W1 and W2) between the pair of side guides are gradually reduced from the upstream side of part detector 30 toward part detecting position S of part detector 30. Therefore, even in a state before part feeding tape T is reached to conveyor 14 and feed hole 20b is engaged with the sprocket of conveyor 14, part detector 30 can stably detect the presence or absence of fine part P in storage 20a of part feeding tape T.

Figure 7A:
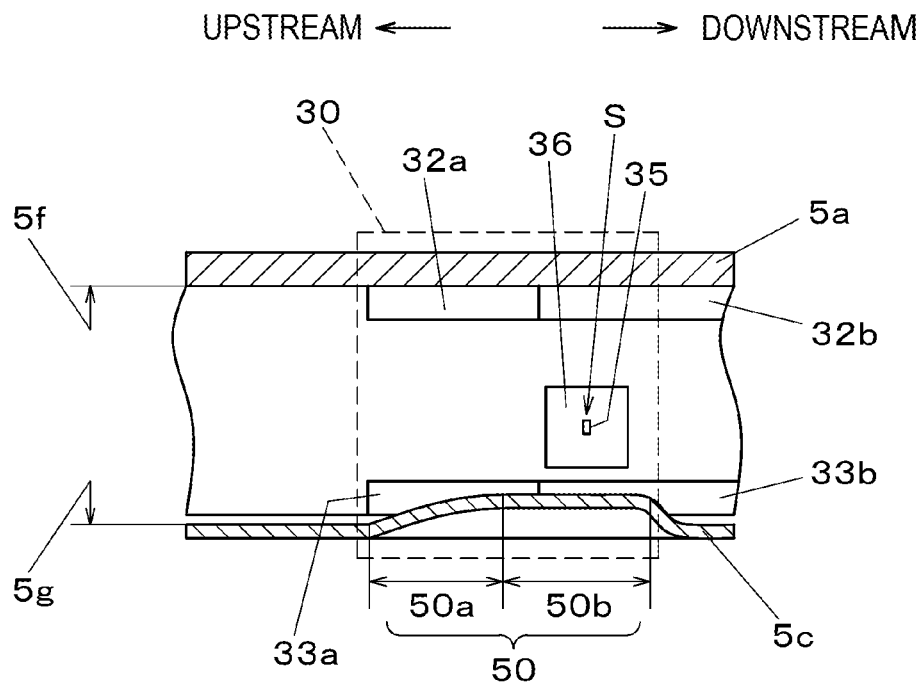
FIG. 7A is an explanatory view of another example of the part feeding device according to the exemplary embodiment of the present disclosure.
Figure 7B:
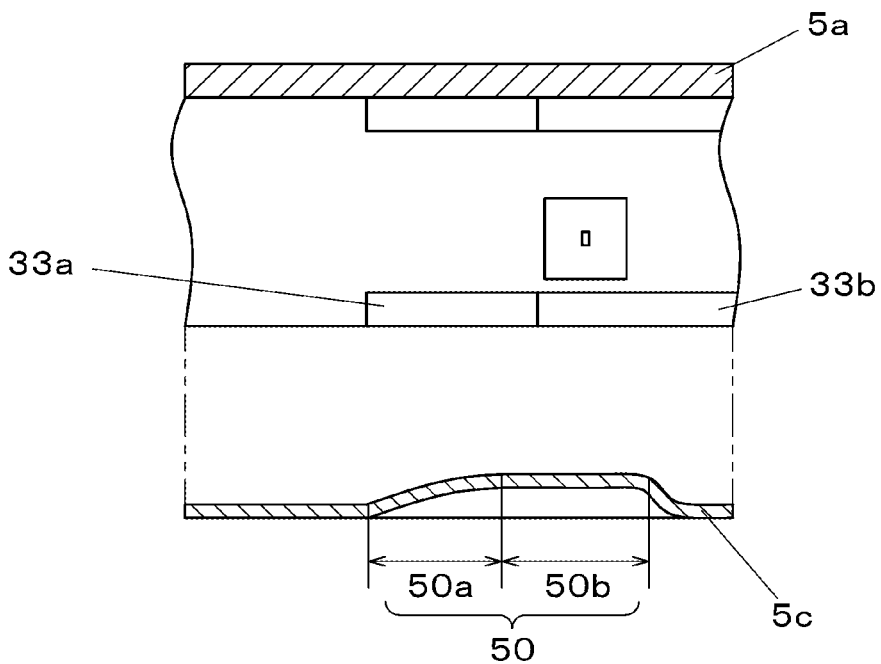
FIG. 7B is an explanatory view of another example of the part feeding device according to the exemplary embodiment of the present disclosure.

Next, another example of tape feeder 5 (part feeding device) of the present exemplary embodiment will be described with reference FIGS. 7A and 7B. In the example of FIGS. 7A and 7B, a description in which there is no change except that guide member 40 is used instead of projection 50 which is provided in cover plate 5c will be described and the same reference numerals are applied to the portions without any changes. FIG. 7A illustrates a state where cover plate 5c is attached to main body 5a. FIG. 7B illustrates a state where cover plate 5c is removed from main body 5a.

In FIG. 7A, second side surface 5g in the vicinity of part detecting position S becomes projection 50 which is projected to first side surface 5f side. Projection 50 is configured to include squeezed portion 50a at the upstream side and stabilizer 50b at the downstream side. The side surface of squeezed portion 50a is gradually closer to facing first side surface 5f from the upstream side of part detector 30 toward part detecting position S. Squeezed portion 50a has a shape in which a width of transporting passage 10 is reduced (squeezed).

Stabilizer 50b is parallel to first side surface 5f facing the side surface thereof from the terminal end at the downstream side of squeezed portion 50a. Part detecting position S is positioned within a range of stabilizer 50b in the transporting direction of part feeding tape T. When cover plate 5c is formed by press processing, projection 50 can perform processing at the same time by using a mold including a convex portion.

In this case, the second side guide of tape feeder 5 of another example is cover plate 5c for covering main body 5a of tape feeder 5 (part feeding device) and the vicinity of part detecting position S of cover plate 5c becomes projection 50 which projects to first side surface 5f (first side guide) side. Therefore, the side surface of a part of projection 50 becomes squeezed portion 50a which is gradually closer to the first side guide side from the upstream side of part detector 30 toward part detecting position S of part detector 30. Therefore, even in a state before part feeding tape T is reached to conveyor 14 and feed hole 20b is engaged with the sprocket of conveyor 14, part detector 30 can stably detect the presence or absence of fine part P in storage 20a of part feeding tape T.

The part feeding device of the present disclosure is a part feeding device for transporting part feeding tape T which stores part P in storage 20a to part removing position 12 and feeding part P stored in storage 20a to the part mounting apparatus (tape feeder 5). The part feeding device of the present disclosure includes main body 5a, conveyor 14, and part detector 30. Main body 5a includes transporting passage 10 for guiding part feeding tape T from insertion port 10a for inserting part feeding tape T to part removing position 12. Conveyor 14 positions storage 20a of part feeding tape T which is inserted from insertion port 10a to transporting passage 10 to part removing position 12. Part detector 30 detects part P stored in storage 20a in transporting passage 10 at the downstream side of insertion port 10a and the upstream side of part removing position 12.

Transporting passage 10 includes travelling surface 10b for supporting part feeding tape T from underneath, a pair of side guides for guiding the side surfaces of part feeding tape T (first side surface 5f and second side surface 5g), and squeezed portion 40a portion in which a distance between the pair of side guides is gradually reduced from the upstream side of part detector 30 toward part detecting position S of part detector 30.

In addition, the part feeding device of the present disclosure may have the following structure.

Part feeding tape T includes one tape side surface 20c and other tape side surface 20d. One tape side surface 20c is closer to a plurality of feed holes 20b which is formed in part feeding tape T than other tape side surface 20d is. Other tape side surface 20d is further from the plurality of feed holes 20b than one tape side surface 20c is. First side surface 5f guides the side surface of one tape side surface 20c and second side surface 5g guides other tape side surface 20d. The side surface of a part of second side surface 5g gradually approaches first side surface 5f from the upstream side of part detector 30 toward part detecting position S of part detector 30.

Furthermore, the part feeding device of the present disclosure may have the flowing configuration.

Second side surface 5g may be configured to include cover plate 5c for covering main body 5a and guide member 40 which is disposed in a position facing transporting passage 10 of cover plate 5c so as to project to transporting passage 10 (refer to FIGS. 6A and 6B). The side surface of a part of guide member 40 gradually approaches first side surface 5f from the upstream side of part detector 30 toward part detecting position S of part detector 30.

In addition, another part feeding device of the present disclosure may have the following configuration.

Second side surface 5g is cover plate 5c for covering main body 5a. Cover plate 5c includes projection 50 which is formed to project toward first side surface 5f side in a vicinity of part detecting position S (refer to FIGS. 7A and 7B). The side surface of a part of projection 50 gradually approaches first side surface 5f from the upstream side of part detector 30 toward part detecting position S of part detector 30.

The part mounting apparatus of the present disclosure further includes mounting head 9 for removing part P from storage 20a positioned in part removing position 12 to mount the removed part on substrate 3 in the above described part feeding device (tape feeder 5).

The part feeding device and part mounting apparatus of the present disclosure have an effect that the fine part can be stably detected. Accordingly, the part feeding device and the part mounting apparatus are useful in a part mounding field for mounting the part on the substrate.

What is claimed is:

1. A part feeding device which transports a part feeding tape to a part removing position to feed a part stored in a storage of the part feeding tape to a part mounting apparatus, the part feeding device comprising:
  a main body including a transporting passage for guiding the part feeding tape from an inserting port for inserting the part feeding tape to the part removing position;
  a conveyor for positioning the storage of the part feeding tape in the transporting passage to the part removing position, wherein the part feeding tape is inserted from the inserting port into the transporting passage; and
  a part detector for detecting the part stored in the storage in the transporting passage, wherein the part detector is located at a downstream side of the inserting port and at an upstream side of the part removing position,
  wherein the transporting passage includes
    a travelling surface for supporting the part feeding tape from underneath,
    a pair of side guides for guiding side surfaces of the part feeding tape, and
    a squeezed portion in a distance between the pair of side guides, wherein the squeezed portion gradually reduces the transporting passage from an upstream side of the part detector toward a part detecting position of the part detector.

2. The part feeding device of claim 1,
wherein the pair of side guides includes a first side guide and a second side guide,
the part feeding tape has a first side surface and a second side surface,
the first side surface is closer to a plurality of feed holes than the second side surface, wherein the plurality of feed holes is formed in the part feeding tape,
the second side surface is further from the plurality of feed holes than the first side surface is,
the first side guide guides the first side surface,
the second side guide guides the second side surface, and
a side of the second side guide gradually approaches the first side guide from the upstream side of the part detector toward the part detecting position of the part detector.

3. The part feeding device of claim 2,
wherein the second side guide is configured to include
a cover plate for covering the main body, and
a guide member which is disposed in a position facing the transporting passage of the cover plate so as to project to a transporting passage side, and
a side of the guide member gradually approaches the first side guide from the upstream side of the part detector toward the part detecting position of the part detector.

4. The part feeding device of claim 2,
wherein the second side guide is a cover plate for covering the main body,
the cover plate includes a projection which is formed to project toward the first side guide side in a vicinity of the part detecting position, and
a side of the projection gradually approaches the first side guide from the upstream side of the part detector toward the part detecting position of the part detector.

5. A part mounting apparatus which transports a part feeding tape to a part removing position and removes a part from a storage of the part feeding tape in the part removing position to mount the part on a substrate, the part mounting apparatus comprising:
a main body including a transporting passage for guiding the part feeding tape from an inserting port for inserting the part feeding tape to the part removing position;
a conveyor for positioning the storage of the part feeding tape in the transporting passage to the part removing position, wherein the part feeding tape is inserted from the inserting port into the transporting passage;
a part detector for detecting the part stored in the storage in the transporting passage located at a downstream side of the inserting port and at an upstream side of the part removing position, wherein the part detector is; and
a mounting head which removes the part from the storage that is positioned in the part removing position to mount the part on the substrate,
wherein the transporting passage includes
a travelling surface for supporting the part feeding tape from underneath,
a pair of side guides for guiding side surfaces of the part feeding tape, and
a squeezed portion in a distance between the pair of side guides, wherein the squeezed portion gradually reduces the transporting passage from an upstream side of the part detector toward a part detecting position of the part detector.

6. The part mounting apparatus of claim 5,
wherein the pair of side guides includes a first side guide and a second side guide,
the part feeding tape has a first side surface and a second side surface,
the first side surface is closer to a plurality of feed holes than the second side surface, wherein the plurality of feed holes is formed in the part feeding tape,
the second side surface is further from the plurality of feed holes than the first side surface is,
the first side guide guides the first side surface,
the second side guide guides the second side surface, and
a side of the second side guide gradually approaches the first side guide from the upstream side of the part detector toward the part detecting position of the part detector.

7. The part mounting apparatus of claim 6,
wherein the second side guide is configured to include
a cover plate for covering the main body, and
a guide member which is disposed in a position facing the transporting passage of the cover plate so as to project to a transporting passage side, and
a side of the guide member gradually approaches the first side guide from the upstream side of the part detector toward the part detecting position of the part detector.

8. The part mounting apparatus of claim 6,
wherein the second side guide is a cover plate for covering the main body,
the cover plate includes a projection which is formed to project toward the first side guide side in a vicinity of the part detecting position, and
a side of the projection gradually approaches the first side guide from the upstream side of the part detector toward the part detecting position of the part detector.

* * * * *